United States Patent [19]
Koyama et al.

[11] Patent Number: 5,774,019
[45] Date of Patent: Jun. 30, 1998

[54] LOW DISTORTION DIFFERENTIAL AMPLIFIER CIRCUIT

[75] Inventors: Mikio Koyama, Tokyo; Hiroyuki Kimura, Kanagawa, both of Japan

[73] Assignee: Lucent Technologies Inc., Murray Hill, N.J.

[21] Appl. No.: 636,484

[22] Filed: Apr. 23, 1996

[30] Foreign Application Priority Data

Feb. 10, 1995 [JP] Japan ................................ 7-045047

[51] Int. Cl.⁶ ............................................ H03F 3/45
[52] U.S. Cl. ...................................... 330/252; 330/259
[58] Field of Search .................................. 330/252, 253, 330/258, 259, 261

[56] References Cited

U.S. PATENT DOCUMENTS

| | | | |
|---|---|---|---|
| 4,163,950 | 8/1979 | Dann et al. | 330/252 |
| 4,667,166 | 5/1987 | Itoh | 330/259 X |
| 5,218,318 | 6/1993 | Ikuzawa | 330/259 X |

*Primary Examiner*—Steven Mottola

[57] ABSTRACT

The invention is a low distortion differential amplifier circuit with the following characteristics: there are outputs OUT1, OUT2, inputs IN1, IN2; a ground GND that is connected to each of the current sources 14, 16; each transistor 10, 12 is connected in series to each of the above outputs OUT1, OUT2 and to each of the current sources 14, 16; each of the above transistors' 10, 12 base (or gate) is connected to the output of an operational amplifier 18, 20; each of the above transistors' 10, 12 emitter (or source) is connected by the resistor 22; the positive input of each of the above operational amplifiers 18, 20 is connected to one of the above inputs IN1, IN2; the terminal of each of the above transistors 10, 12 that is connected to the resistor is also connected to a voltage source 30, 32 which is then connected to the negative input of the above operational amplifier 18, 20. Transistors with special bases (or gates) are used in the input stage of the operational amplifiers mentioned above.

4 Claims, 8 Drawing Sheets

LOW DISTORTION DIFFERENTIAL AMPLIFIER CIRCUIT

TECHNICAL FIELD

This device is designed to be used in circuits that will benefit from a lower voltage, lower current differential amplifier.

BACKGROUND OF THE INVENTION

In recent years with the expansion of the cellular telephone field, there is a great need for a device that can amplify the extremely small voltages (and currents) of the signals inside the phone. Currently, there are various circuits that carry out this amplification function: however, it is difficult for conventional amplifiers operating on a low voltage source to keep output voltage and current distortion low relative to the input voltage and current.

A conventional design of a differential amplifier uses an emitter coupled pair, and since it is necessary for a linear input and output voltage, often an emitter degeneration resistor is connected in series between the pair of emitters. However, in the case where it is necessary for lower distortion input and output, and a more efficient use of the power source, M. Koyama in the paper, "A 2.5V Active Low-pass Filter Using All NPN Gilbert Cells with a 1Vpp Linear Input Range" (IEEE J. Solid State Circuits, Vol. SC-28, No. 12, pp 1246–1253, Dec. 1993) explains that by using a degeneration resistor in a coupled pair, shown in FIG. 4, an improvement in the circuit is achieved by a more linear operation of the operational amplifier.

FIG. 1 is a schematic of the previously mentioned conventional emitter coupled pair differential amplifier circuit. This conventional circuit consists of NPN transistors 10, 12 connected to output terminals OUT1, OUT2 and to current sources 14, 16 which are grounded GND. Each NPN transistor 10,12 has the output of an operational amp 18, 20 connected to its base, the emitters of NPN transistor 10, 12 are connected by resistor 22. The positive inputs IN1, IN2 of the operational amplifiers 18, 20 are inputs for the signal, the negative input of each operational amplifier 18, 20 is driven by the output from the emitter of the NPN transistor 10, 12.

Next, FIG. 2 is used to explain that when an operational amplifier is used in a conventional feedback low distortion operational amplifier circuit, the input voltage range is limited, which causes a limiting of the range of output voltages. This figure shows only one side of the differential amplifier circuit, one NPN transistor 12, current source 16, and operational amplifier 20. The input stage of operational amplifier 20 is actually made up of transistors 60, 62, 64 wired in the way shown inside the box. FIG. 2 also shows the main associated with each element in the circuit, namely, transistor 12, current source 16, and operational amplifier 20.

In a conventional low distortion amplifier circuit the lowest power source voltage Vcc necessary for the operation of the amplifier depends upon the highest voltage necessary in operating the base of the transistors 10, 12, since the output voltage of the operational amplifier depends upon the input voltage from the power source Vcc. Therefore, in FIG. 2 when the voltage of inputs IN1, IN2, is 0V, the lowest voltage necessary for normal operation of transistors 10, 12 at the base is Vb2, and if this is added to the desired gain in voltage at the base of transistor 12, the result is the value of the lowest necessary voltage of the power sources Vcc. This is expressed in the following formula:

$$Vcc = Vb2 + Vin \quad \text{(Formula 1)}$$

If the voltage Vbe3 across the base and emitter of transistor 60 and the saturation voltage Vce5(sat) across the collector and emitter of transistor 64, are added to the voltage across the emitter coupled transistor's base and emitter (the voltage Vbe2 across the base and emitter of transistor 12) the result is the lowest voltage Vb2 for the base. This is expressed in the following formula:

$$Vb2 = Vbe3 + Vce(sat) + Vbe2 \quad \text{(Formula 2)}$$

Typical values for the transistors are as follows:

$$Vbe3 = Vbe2 = Vbe = 0.7V$$

$$Vce5(sat) = Vce(sat) = 0.15V$$

If these values are inserted into Formula 2 then:

$$Vb2 = 0.7V + 0.15V + 0.7V = 1.55V \quad \text{(Formula 3)}$$

If Vin=0.5 is assumed and inserted into Formula 1, then the necessary operating power source voltage Vcc is as follows:

$$Vcc = 1.55V + 0.5V = 2.05V \quad \text{(Formula 4)}$$

Therefore, in a conventional operational amplifier circuit, the necessary operating voltage of the power source is 2.05V. In this case with an input voltage Vin, voltage Vb2 is not directly affected by the amplification. In addition, Vb2 is part of the voltage Vcc. If this percentage is computed using the numbers above then:

$$Vb2/Vcc = 1.55V/2.05v - 75.6\% \quad \text{(Formula 5)}$$

Therefore, 75.6% of voltage Vcc does not contribute to the change of the input voltage.

FIG. 1 is a conventional feedback low distortion differential amplifier circuit using an operational amplifier and running on source voltage Vcc mentioned above; the output terminals OUT1, OUT2 are the collectors of transistors 10, 12 which have the functional output voltage Vo and the minimum voltage Vc2. The relationship of the two is shown in the following formula:

$$Vo = Vcc - Vc2 \quad \text{(Formula 6)}$$

If the saturation voltage Vce2(sat) across the collector and emitter of transistor 12 and the voltage Vbe3 across the base and emitter of transistor 60, are added to the saturation voltage Vce5(sat) across the collector and emitter of transistor 64, the result is Vc2. This is expressed in the following formula:

$$Vc2 = Vce2(sat) + Vbe3 + Vce5(sat) \quad \text{(Formula 7)}$$

If the typical values mentioned above are used for the transistors then:

$$Vce2 = Vce5(sat) = Vce(sat) = 0.15V$$

$$Vbe3 = Vbe = 0.7V$$

If these values are inserted into Formula 7 then:

$$Vc2 = 0.15V + 0.7V + 0.15V = 1.0V \quad \text{(Formula 8)}$$

If the value Vcc=2.05V mentioned above is inserted into Formula 6 then the functional output voltage Vo is as follows:

$$Vo = 2.05V - 1.0V = 1.05V$$

In this case the percentage p1 of efficiency power source use is as follows:

p1=Vo/Vcc=1.05V/2.05V=51.2%   (Formula 10)

The circuit mentioned above shown in FIG. 1 consists of operational amplifiers 18, 20, the operational amplifier shown in FIG. 3 has as input stage made of PNP transistors. This differs from FIG. 2 since the lowest value of the voltage Vb2 of the base of transistor 12 has a different limit due to the operational amplifier 20; if the voltage Vbe2 across the base and emitter of transistor 12, which is operating with the minimum operating voltage, is added to the saturation voltage Vce8(sat) across the collector and emitter of transistor 68 in the power source, the result is Vb2. This is expressed in the following formula:

Vb2=Vbe2+Vce8(sat)   (Formula 11)

However, if the voltage across the base and emitter of the PNP transistor is the same value as the saturation voltage across the collector and emitter of the NPN transistor, and if a PNP transistor like transistor 74 in FIG. 3 has a minimum emitter voltage Ve15 that is greater than Vb2 then the source voltage depends upon the limit of Ve15.

In other words, if the saturation voltages Vce15(sat), Vce8(sat) across the collectors and emitters of transistors 74, 68 are added to the voltage Vbe3 across the base and the emitter of transistor 70 the result is Ve15. This is expressed in the following formula:

Ve15=Vce15(sat)+Vce8(sat)+Vbe13   (Formula 12)

Typical values are as follows:

Vbe2=Vbe13=Vbe=0.7V

Vce8(sat)=Vce15(sat)=Vce(sat)=0.15V

These values result in the following formula:

Ve15−Vb2=Vce(sat)>0

To determine the necessary source voltage Vcc based upon the input voltage Vin, the following formula is used:

Vcc=Ve15+Vin=Vce(sat)×2+Vbe+Vin

If Vin=0.55V is inserted then:

Vcc=0.15V×2+0.7V+0.5V=1.5V

This result is less than the result using Formula 4, so compared to the circuit design in FIG. 2, this one has a power source with a lower operating voltage.

At this point the disadvantages are listed of using a PNP transistor instead of an NPN transistor which use, for operational amplifiers 18, 20.

1. Not suitable for high speed operation.
2. Too much chip area is required for a phase shift compensation capacitor.
3. Low capacity for current, so the chip area per unit of current is large.
4. It tends to become unstable, so there is a fear of oscillation.
5. If the current in the substrate becomes to large, it will have effects on other parts of the circuit attached to the substrate.
6. If the percentage of the current being amplified is small accuracy is effected, since there is a large base current.

For the reasons above it is desirable to design the circuits of operational amplifiers 18, 20 using NPN transistors 60, 62 shown in FIG. 2 for the input stage.

SUMMARY OF THE INVENTION

Considering conventional differential amplifier circuits the aim of this invention is solving the problem of non-linearity, while offering a differential amplifier circuit with a wider input range. Moreover, the aim of this invention is not to use PNP transistors in the signal amplification stage, but still offer an amplifier with a low operating voltage and low distortion.

Figure 1:
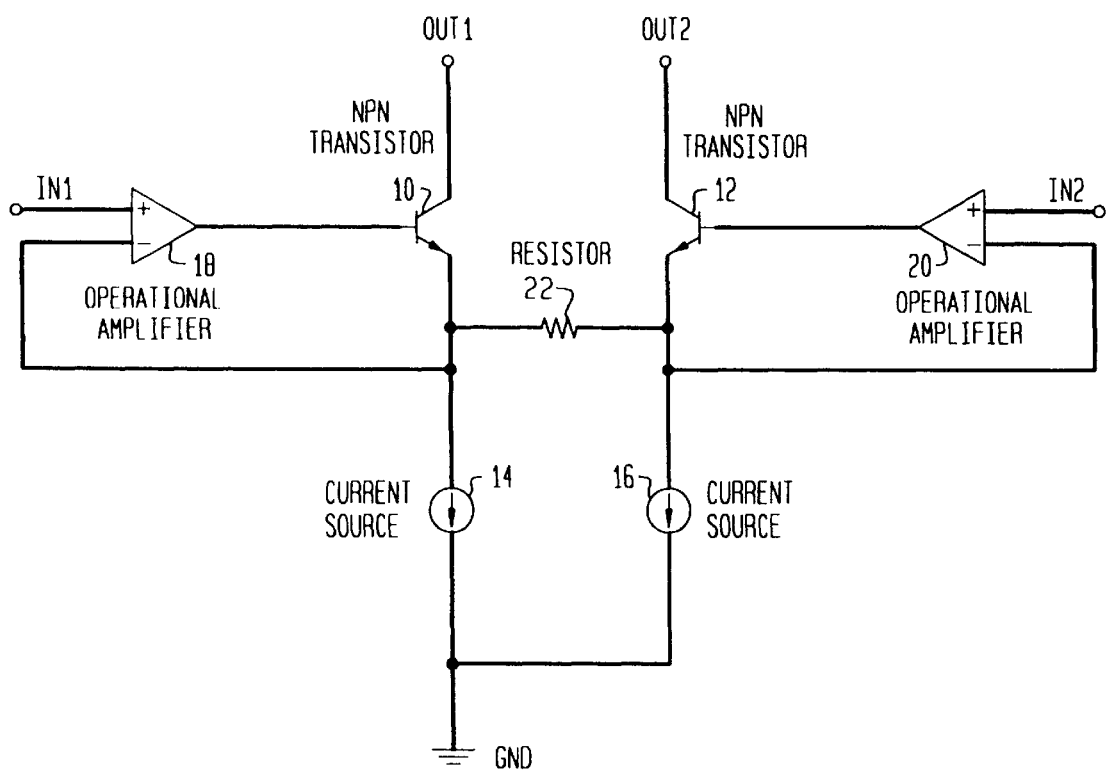
FIG. 1 is a schematic of a conventional feedback differential amplifier circuit.
Figure 2:
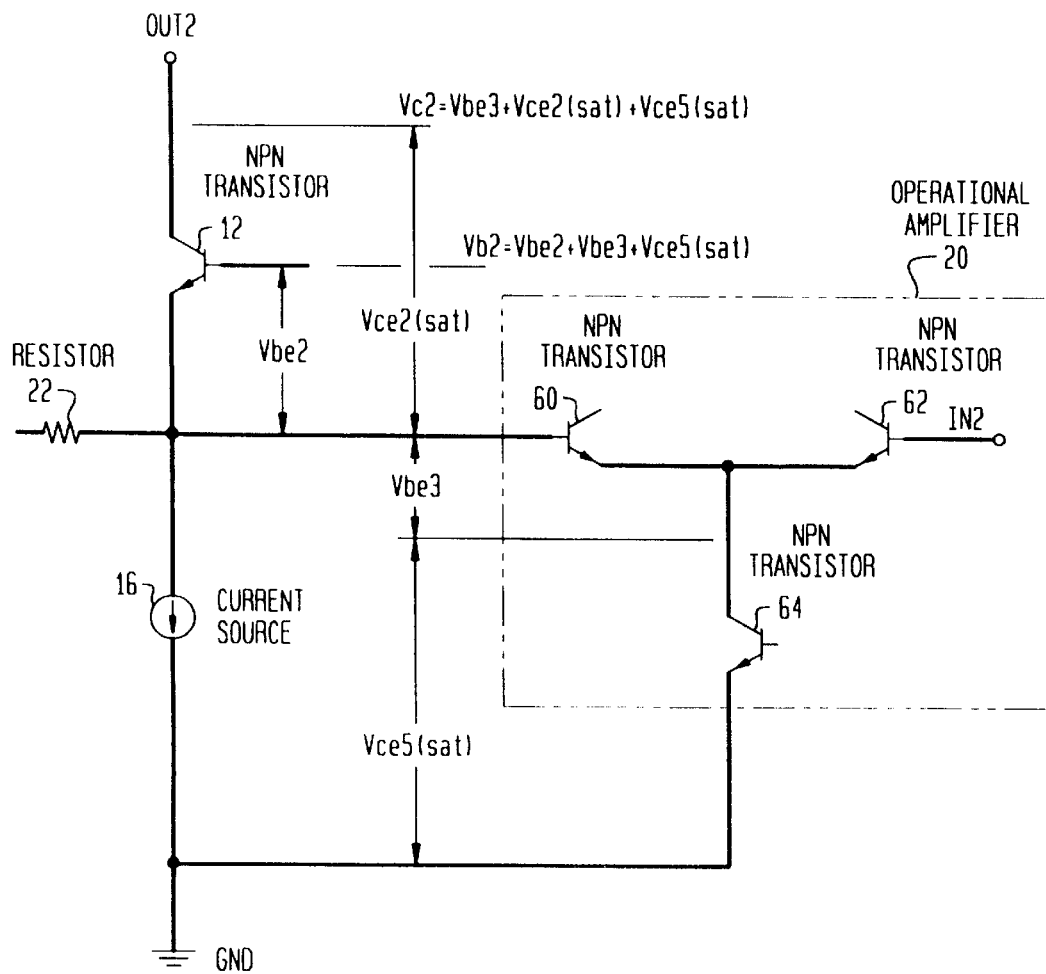
FIG. 2 is a schematic showing the voltage flow through each element of a conventional differential amplifier circuit.
Figure 3:
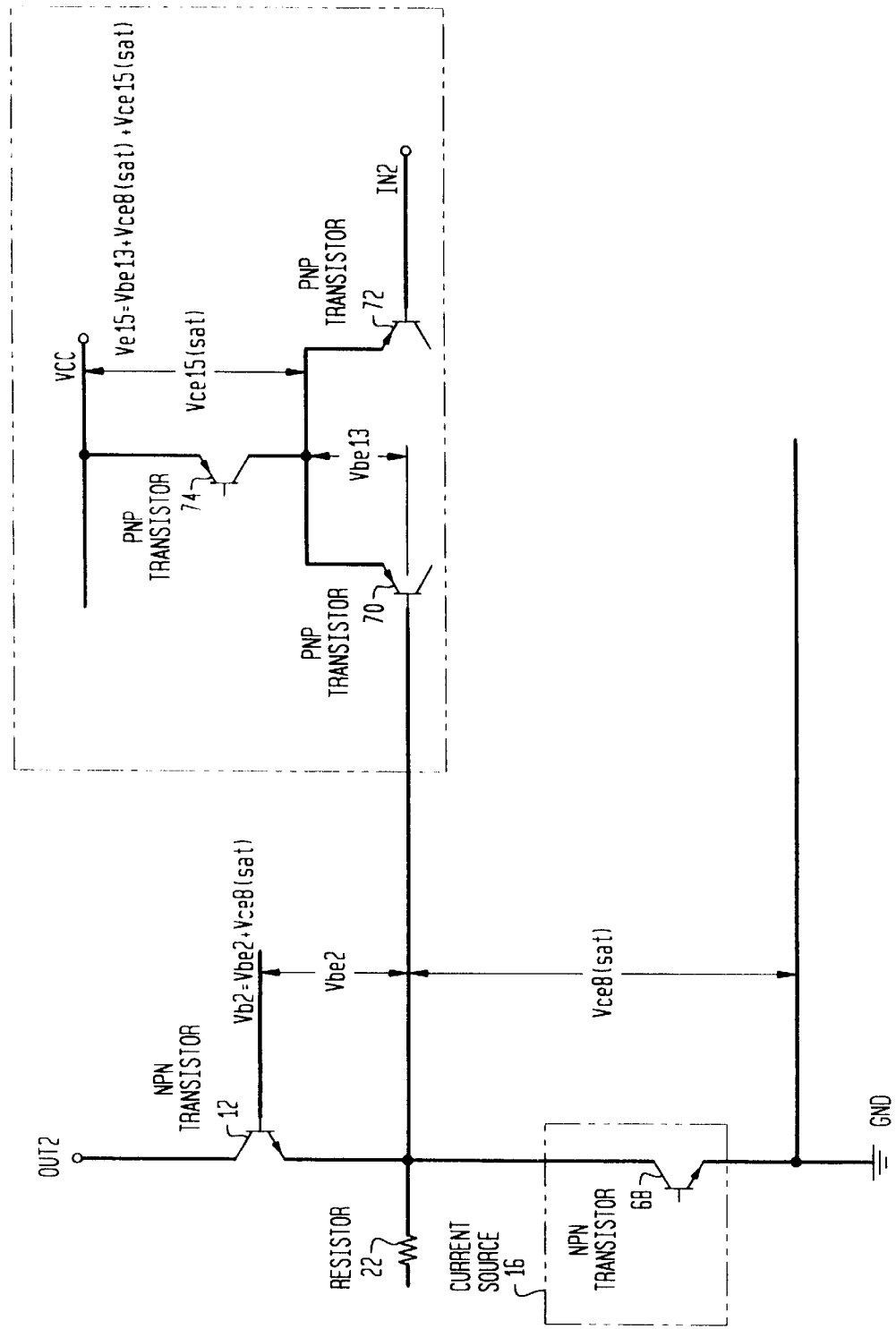
FIG. 3 is a schematic showing the voltage flow through each element of a conventional differential amplifier circuit using PNP transistors in the input stage.

Explanation of the Numbers Used in the Drawings

| | |
|---|---|
| 10, 12 | NPN transistors |
| 10', 12' | FET |
| 14, 16 | Current Sources |
| 18, 20 | Operational Amplifiers |
| 22 | Resistor |
| 30, 32 | Voltage Source |
| 40, 42 | NPN Transistors |
| 44, 46 | Current Sources |
| 50 | NPN Transistor |
| 52 | Power Source |
| 54, 56 | Resistors |
| 60, 62 | NPN Transistors |
| 60', 62' | FET |
| 64, 66, 68 | NPN Transistors |
| 70, 72, 74 | PNP Transistors |
| 76, 78 | PNP Transistors |
| 80, 82 | NPN Transistors |
| 80', 82' | FET |
| 84, 86, 88 | NPN Transistors |
| 90, 92 | NPN Transistors |
| 94, 96 | NPN Transistors (96 in FIG. 7) |
| 96, 98 | PNP Transistors (96 in FIG. 5) |

DETAILED DESCRIPTION

Figure 4:
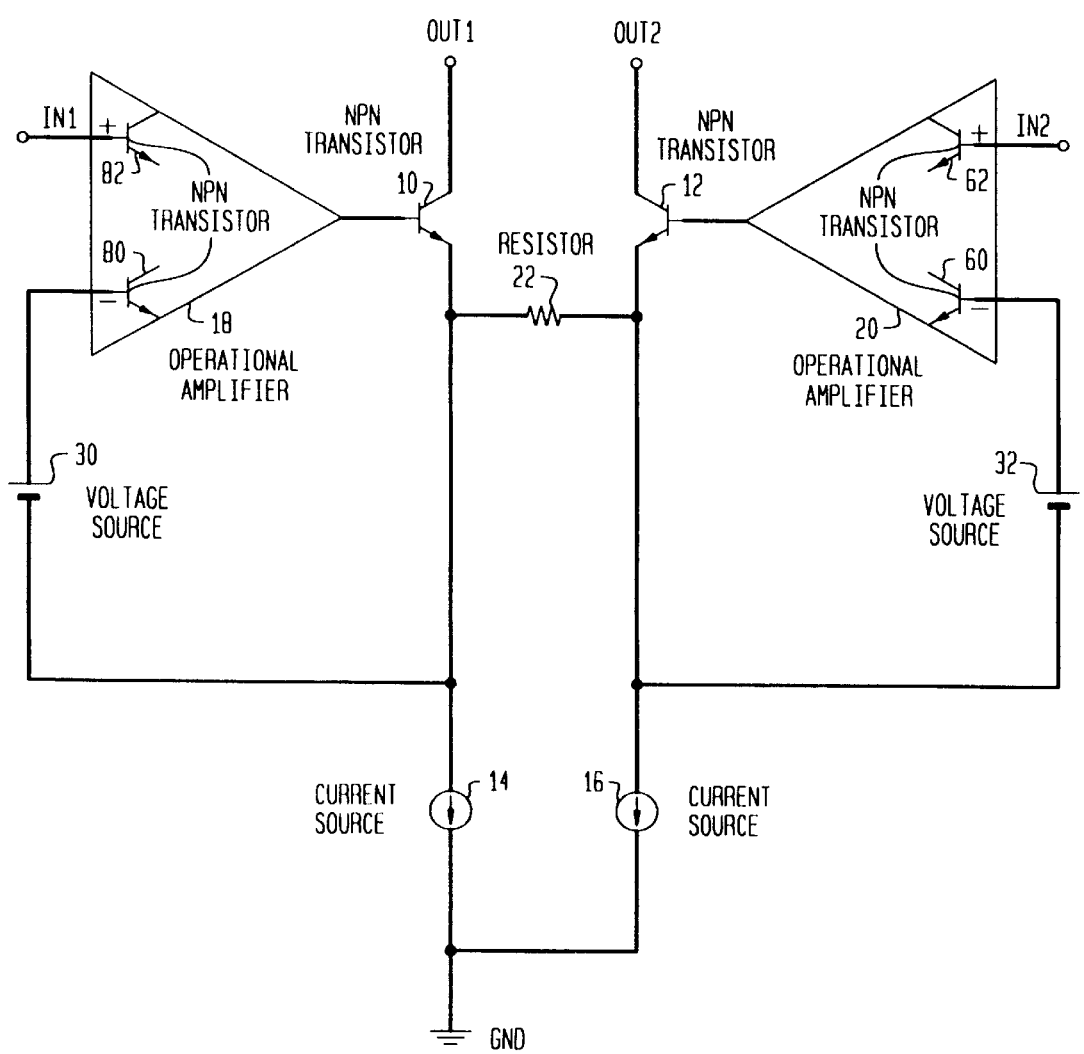
FIG. 4 is a simplified schematic of circuit which is design #1 of this invention.

This invention shown in FIG. 4 contains operational amplifiers 18, 20 with their negative inputs connected to the emitters of transistors 10, 12 and voltage sources 30, 32. The input voltage Vin at inputs IN1, IN2 does not change, so in order to lower the voltage coming from the emitters of transistors 10, 12 voltage sources 30, 32 are inserted at these points. This means that the voltages on the bases of transistors 10, 12 can be lowered, if only the portion of source voltage Vcc associated with voltage sources 30, 32 is lowered. Therefor, low voltage operation is possible. Or, in the case of using the voltage source in conventional circuits it is possible to widen the voltage range of the inputs IN1, IN2 using only voltage sources 30, 32.

Referring to FIG. 4, each collector of NPN transistors 10, 12 is connected to outputs OUT1, OUT2 respectively, the current sources 14, 16 are connected to each emitter and to the ground GND. Each base of these transistors 10, 12 is connected to the respective output of the operational amplifiers 18, 20, and the emitters are connected by resistor 22. The positive inputs of the operational amplifiers 18, 20 are each connected to an input terminal IN1, IN2, and the negative inputs of the operational amplifiers 18, 20 each receive the output of the emitter of a transistor 10, 12 with the power source 30, 32 bridging the connection.

Figure 5:
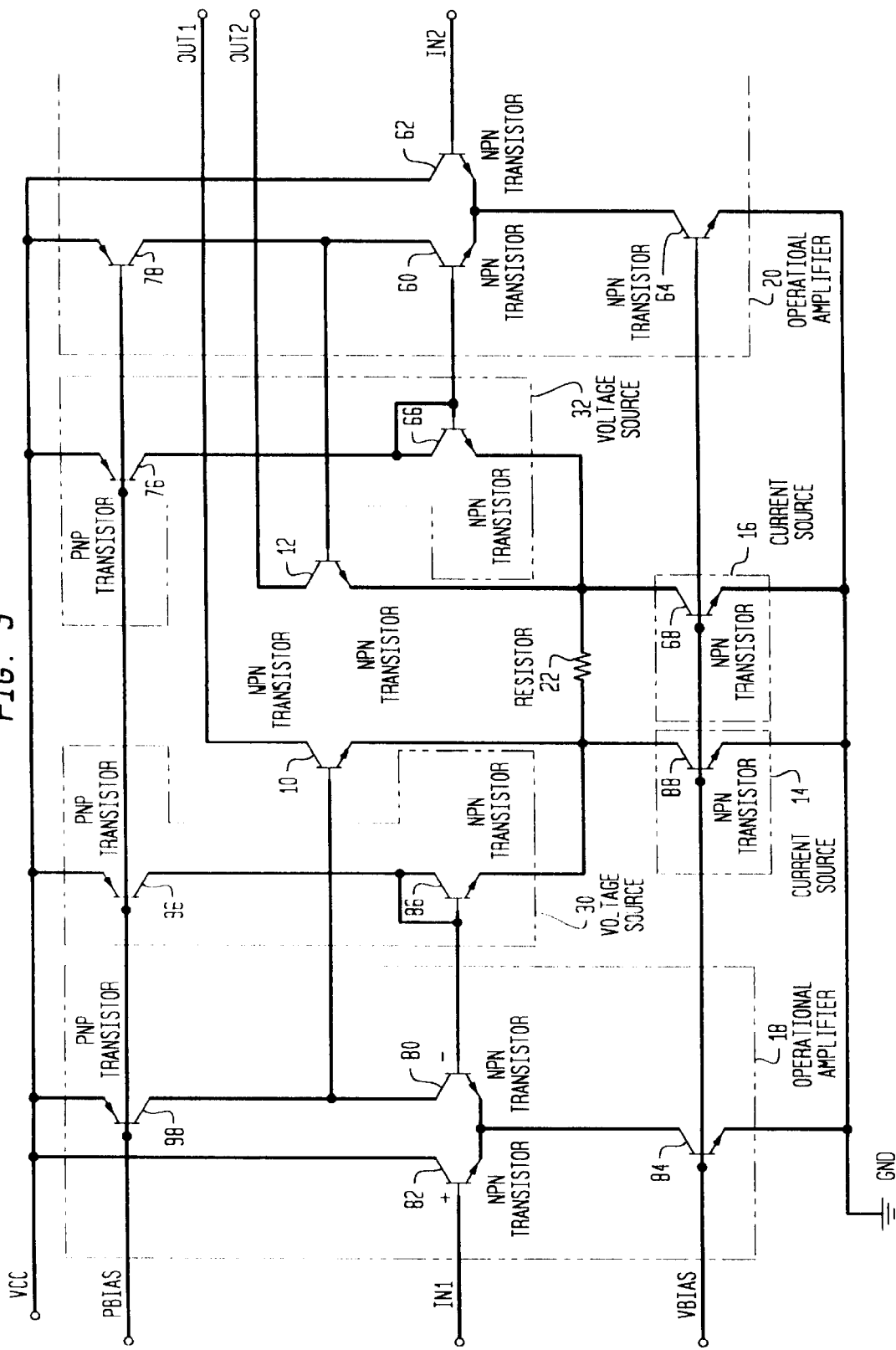
FIG. 5 is a schematic of an operational circuit of design #1 of this invention.
Figure 6:
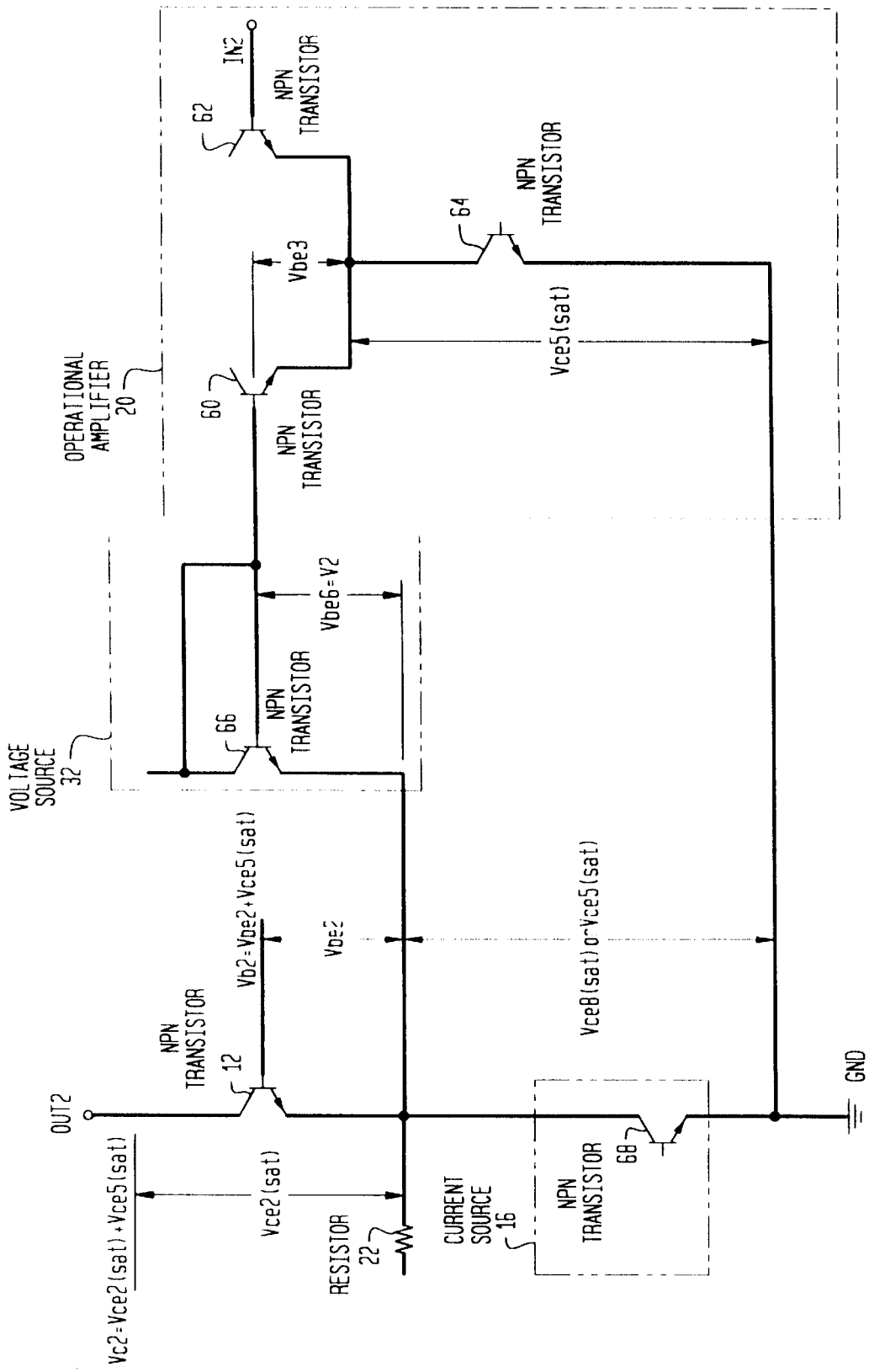
FIG. 6 is a schematic showing the voltage flow through each element of the circuit of design #1 of this invention.

The circuit in FIG. 5 is a more realistic version of the one in FIG. 4. The PNP transistors 76, 78, 96, 98 in FIG. 5 have no effect on the power supply which is used in the amplification of the signal. In addition the bias voltage at terminals PBIAS and VBIAS which are necessary for the circuit's operation, come from an external section. FIG. 6 shows one side of the differential amplifier circuit in FIG. 5, only transistor 12, power source 16, operational amplifier 20, and voltage source 32. The connections of transistors 60, 62, 64 which make up the input stage of operational amplifier 20, are shown inside the box. The connections of transistor 66 which makes up the voltage output section of voltage source 32, and the connections of transistor 68 which makes up the current output section of current source 16 are each boxed by a solid line. The main voltages related to each element in the circuit, NPN transistor 12, power source 16, operational amplifier 20, and voltage source 32, are shown in FIG. 6.

At this point the actual value of voltage source 32 and the voltage across the bases and emitters of the transistors in FIG. 6 will be shown.

If the saturation voltage Vce5 across the collector and base of transistor 64 is added to the voltage Vbe3 across the base and emitter of transistor 60, and then if the voltage V2 of voltage source 32 is subtracted from the previous sum, the result is in relation to the ground GND of the lowest emitter voltage Ve2 of transistor 12. This is expressed in the following formula:

$$Ve2=Vce5(sat)+Vbe3-V2 \qquad (\text{Formula 13})$$

From this it can be seen that it may be necessary to increase just the voltage V2 of voltage source 32 in order to lower the operating voltage. In a conventional feedback differential amplifier circuit the lowest base voltage Vb2 of transistor 12 is shown in Formula 2; however, in this case when just voltage V2 of voltage source 32 equals 0V, if Ve2 is sufficiently greater than the lowest operating voltage of current source 16 then it is not necessary to worry about the adequacy of Ve2; but, according to Formula 13, especially when V2 has no limits, it is necessary to keep the lowest operating voltage of current source 16 from falling, in order to keep Ve2 at the desired value.

In reality, since the output from the current source is consumed by current flow between the collector and emitter, the lowest operating voltage of current source 16 equals the saturation voltage Vce8(sat) across the collector and emitter of transistor 68. This is expressed in the following:

$$Ve2=Vce8(sat) \qquad (\text{Formula 14})$$

Using Formulas 13 and 14, the proper voltage V2 of voltage source 32 is shown in the following formula:

$$V2=Vce5(sat)+Vbe3-Vce8(sat) \qquad (\text{Formula 15})$$

Since transistors 60, 64, 68 have the same properties: Vce5(sat)=Vce8(sat)=Vce(sat) and Vbe3=Vbe, if this if inserted into Formula 15 the result is as follows:

$$V2=Vbe \qquad (\text{Formula 16})$$

From these formulas the voltage across the base and emitter of a transistor, like transistor 66 inside voltage source 32, shown in the realistic circuit design of FIG. 6, can be determined.

Now an explanation of the operational voltages in FIG. 6 will be done in the same way it was done for a conventional feedback differential amplifier.

According to the above explanation, since voltage source 32 does not influence the input of operational amplifier 20, the operational range does not have the limitations of a conventional circuit.

If the voltage of the emitter of transistor 12 in Formula 14 is added to the voltage Vb2 across the base and emitter of transistor 12, the result is the voltage Vb2 of the base of transistor 12. This is expressed in the following formula:

$$Vb2=Vbe2+Vce8(sat) \qquad (\text{Formula 17})$$

If following values, Vbe2=0.7 and Vce8(sat)=0.15V, are inserted in Formula 17 then:

$$Vb2=0.85V \qquad (\text{Formula 18})$$

If in the same way as above, it is assumed the input voltage Vin is Vin=0.5V then by using Formula 1 the lowest operating source voltage Vcc can be determined. This is expressed in the following formula:

$$Vcc=Vb2+Vin=0.85V+0.5V=1.35V \qquad (\text{Formula 19})$$

If this is compared to a conventional circuits power source voltage of 2.05V there is a difference of 0.7V, or in terms of percentage the following reduction was achieved:

$$(2.05V-1.35)/2.05V=34.1\%$$

In the same way as above, the percentage of Vb2 can be determined. This is shown in the following formula:

$$Vb2/Vcc=0.85V/1.35V=63.0\%$$

If this is compared to the conventional circuits rate of 75.6% rate of power consumption then the following improvement was achieved:

$$75.6\%-63.0\%=12.6\%$$

Next regarding the output side, if the saturation voltages Vce8(sat) and Vce2(sat) across the collectors and emitters of transistors 68 and 12 are added together the result is the minimum collector voltage Vc2 of transistor 12. This is expressed in the following formula:

$$Vc2=Vce8(sat)+Vce2(sat) \qquad (\text{Formula 20})$$

If the output voltage in the formula above is inserted into Formula 6, then:

$$Vo=Vcc-Vc2=Vcc-Vce8(sat)-Vce2(sat) \qquad (\text{Formula 21})$$

The typical value for the transistors is as follows:

$$Vce8(sat)=Vce2(sat)=Vce(sat)=0.15V$$

If the value of Vcc derived in Formula 19 and the value above for the transistors are inserted into Formula 21 then:

$$Vo=1.35V-0.15V-0.15V=1.05V$$

The percentage p2 is the efficiency of the use of the power source based on output power. The formula and the result are shown below:

$$p2 = V_o/V_{cc} = 1.05V/1.35V = 77.8\%$$ (Formula 22)

If this is compared to percentage p1 (Formula 10) of the efficiency of use of the power source in a conventional circuit then the following improvement is achieved:

$$p2-p1 = 77.8\% - 51.2\% = 26.6\%$$

Figure 7:
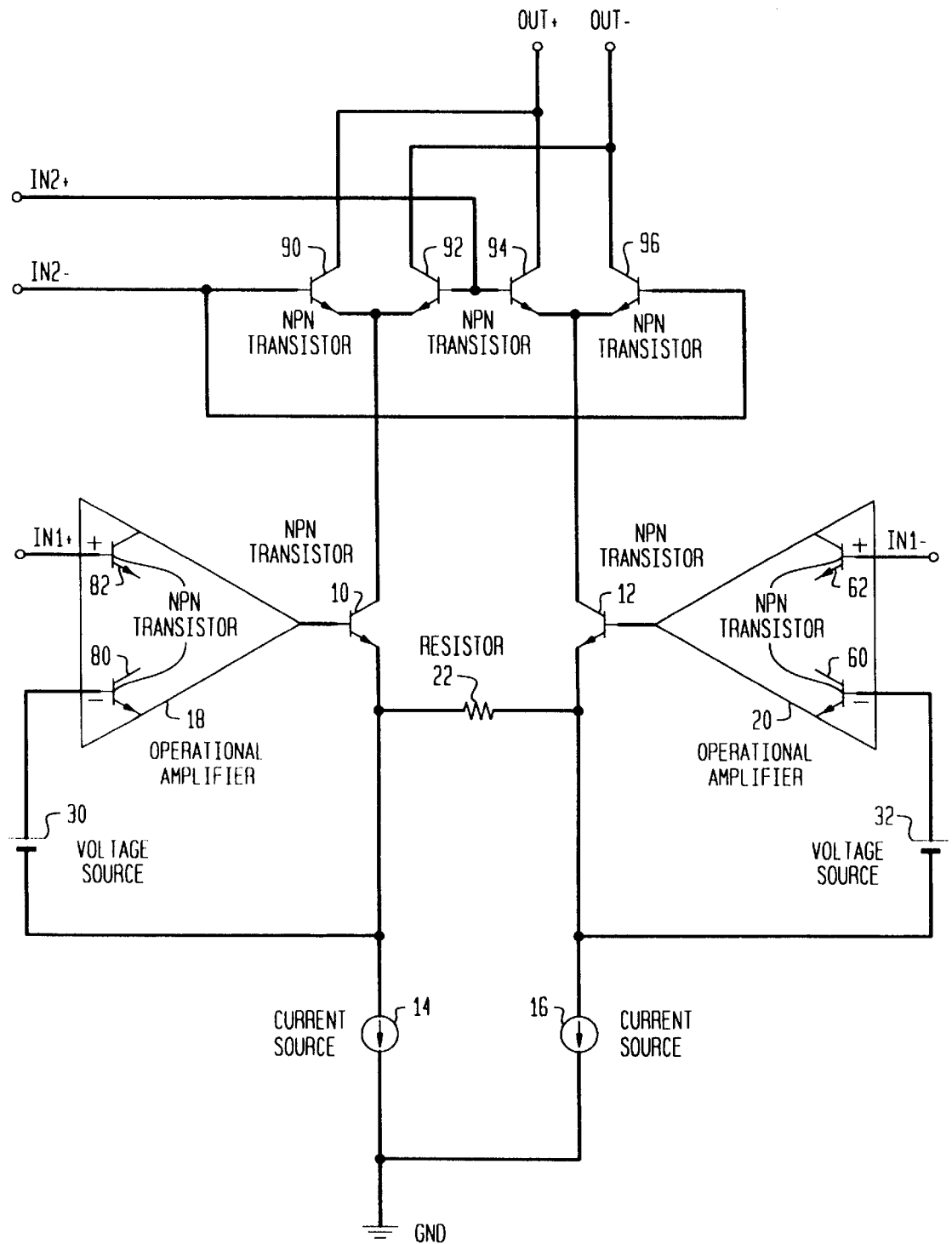
FIG. 7 is a schematic of this invention being used as a balanced modulator.

Next, FIG. 7 is an example of this invention being used as a balanced modulator. When switching a low frequency, low distortion signal on a carrier wave, a balanced modulator is often used; in FIG. 7, using input IN1 for the signal and input IN2 for the carrier wave, this invention is a low distortion balanced modulator.

Figure 8:
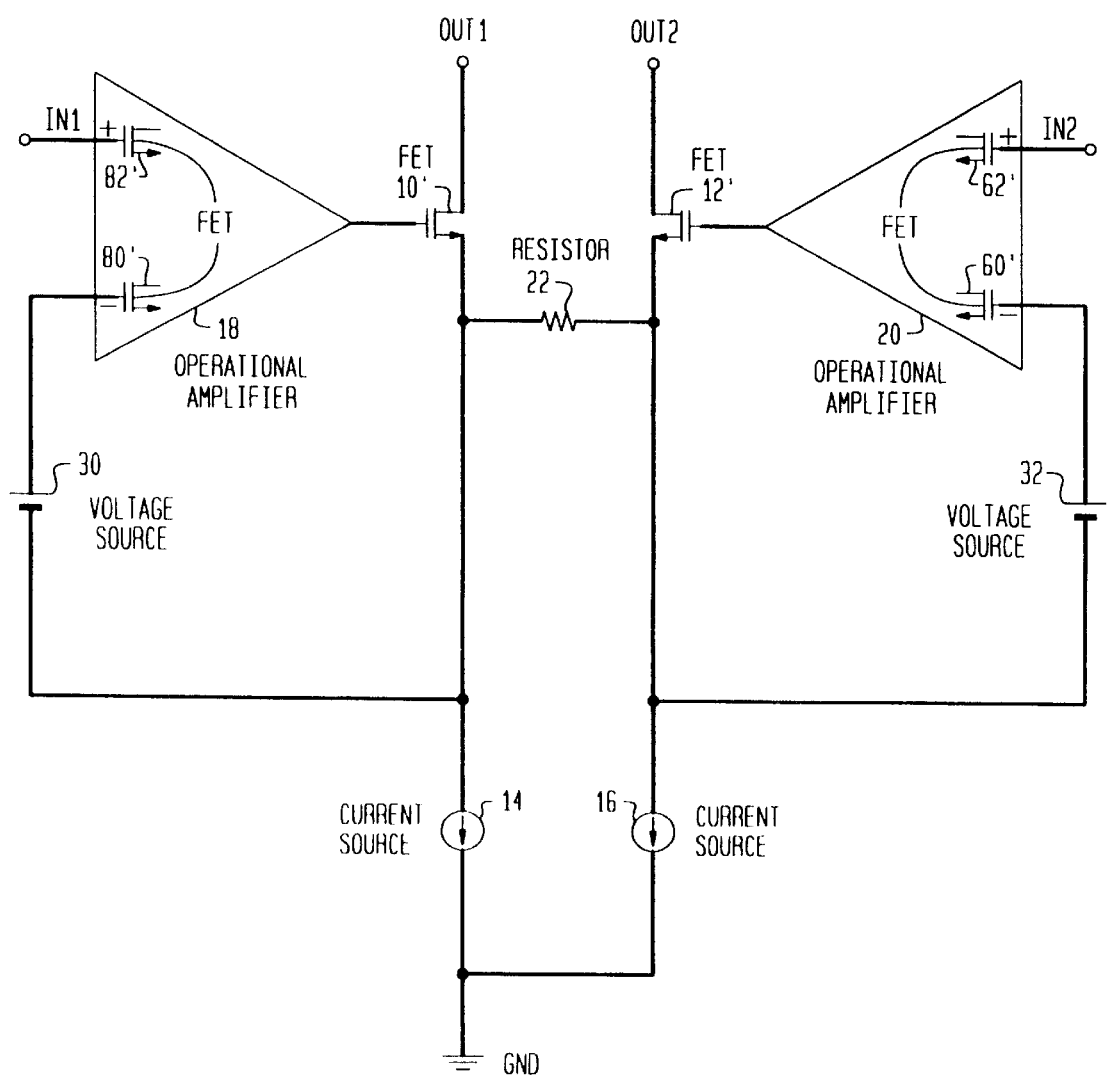
FIG. 8 is a simplified schematic of an operational circuit which is design #2 of this invention.

Above in design #1 of this invention NPN transistors are used in the differential amplifier circuit, FIG. 8 shows an enhancement using field effect transistors (FET). The operation and voltages are the same as FIG. 4.

The differential amplifier circuit of this invention when compared to the conventional technology achieves a remarkable reduction in operating voltage. If this design is used with the same power source voltage of the conventional technology, then a significant improvement is possible in the efficiency in use of the power source. In addition, since the amplifier stage of this invention is made up of only NPN transistors it is possible to avoid the shortcomings of PNP transistors.

The invention claimed is:

1. A low distortion differential amplifier comprising:
   a pair of bipolar transistors, each transistor having a respective output terminal;
   a pair of current sources, each current source being connected in series between a respective emitter of one of said bipolar transistors and ground;
   a pair of operational amplifiers, each of said operational amplifiers having a positive and a negative input, the output of each operational amplifier being connected to a respective base of one of said bipolar transistors;
   a resistor connected between the emitters of said pair of bipolar transistors;
   a pair of voltage sources, each of said voltage sources coupled between the negative input of one of said pair of operational amplifiers and the emitter of the associated bipolar transistor.

2. A low distortion differential amplifier comprising:
   a pair of FET transistors, each transistor having an output terminal, gate terminal and bias terminal;
   a pair of current sources, each current source being connected in series between a respective transistor bias terminal and ground;
   a pair of operational amplifiers, each of said operational amplifiers having a positive and a negative input, the output of each operational amplifier being connected to a respective gate terminal of one of said FET transistors;
   a resistor connected between the bias terminals of each of said transistors;
   a pair of voltage sources, each of said voltage sources coupled between the negative input of one of said pair of operational amplifiers and the bias terminal of its associated FET transistor.

3. The circuit of claim 1 wherein all the said transistors are NPN transistors.

4. The circuit of claim 2 wherein all said transistors are the same polarity FET transistors.

* * * * *